(12) United States Patent
Behun

(10) Patent No.: US 6,683,466 B2
(45) Date of Patent: Jan. 27, 2004

(54) PISTON FOR MODULE TEST

(75) Inventor: John Richard Behun, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,839

(22) Filed: May 17, 2002

(65) Prior Publication Data

US 2003/0214315 A1 Nov. 20, 2003

(51) Int. Cl.[7] .............................................. G01R 31/02
(52) U.S. Cl. ........................................ 324/757; 324/761
(58) Field of Search ................................ 324/754–758, 324/761–762, 765, 158.1; 269/26, 66, 70, 74, 236, 266–267; 439/247, 248, 709, 711

(56) References Cited

U.S. PATENT DOCUMENTS

| 2,918,648 | A | * | 12/1959 | Ludman et al. ............. 439/711 |
| 3,942,778 | A | * | 3/1976 | Fadiga et al. ................ 269/26 |
| 4,112,364 | A | * | 9/1978 | Katz ........................... 324/761 |
| 4,138,643 | A | | 2/1979 | Beck et al. .................. 324/754 |
| 4,730,159 | A | | 3/1988 | Collins ........................ 324/757 |
| 4,912,400 | A | | 3/1990 | Plante ......................... 324/754 |
| 4,922,192 | A | | 5/1990 | Gross et al. ................. 324/754 |
| 5,606,263 | A | * | 2/1997 | Yoshizawa et al. ......... 324/761 |
| 5,984,293 | A | * | 11/1999 | Abrahamson et al. ...... 269/266 |

* cited by examiner

*Primary Examiner*—Ernest Karlsen
*Assistant Examiner*—Minh N. Tang
(74) *Attorney, Agent, or Firm*—Robert A. Walsh

(57) ABSTRACT

A test module having a lid to force a chip in contact with the test pads using a bed of nails to conform to the shape of the chip. The lengths of the nails are cut to conform to be of equal length above the chip with different size heads to apply the proper force. A pressurized bag may be placed above the head of nails to apply force to the chip.

7 Claims, 2 Drawing Sheets

PISTON FOR MODULE TEST

BACKGROUND OF THE INVENTION

This invention relates to a piston probes which are used in testing microscopic circuits such as those which are in semiconductor chips and multichip interconnect modules.

During the fabrication of semiconductor chips, it is necessary that the bare multichip interconnect module (such as that described in U.S Pat. No. 4,721,831) be probed and tested before it receives any integrated circuit chips. Such separate testing avoids expensive reworks and/or scrapping of the unit which the permanently joined chips and module form.

In the prior art, the probing of various contacts on the chips and the interconnect modules was performed by what is commonly called "a bed of nails". This bed of nails is comprised of a plurality of thin wires which are held in a cantilevered fashion such that their ends form a pattern which corresponds to the contacts that are to be probed. Thus the ends of the wires constitute probe tips. Electrical connections between these probe tips and the contacts on the chips or interconnect module are made by mechanically urging them together until the wires deflect slightly.

A problem, however, with these bed of nails probes is that the maximum density of the probe tips is too limited. State of the art probes can only be arranged in patterns of about 10 mils (254 micrometers) on center. By comparison, the transistors and their interconnect lines within an integrated circuit chip and interconnect module can have feature sizes of one micrometer or less.

Also, another problem with the bed of nails probes is that their wires are very fragile and are easily bent. Thus, as a practical matter, the total number of probes in a bed of nails is limited to less than 1,000. By comparison, the total number of contacts on a multichip interconnect module can be several thousand.

Still another problem with the bed of nails probe is that the force between a probe tip and its contact is determined by many factors which are difficult to control. For example, a probe wire may be slightly bent, or the contacts on an interconnect module may be at slightly different heights. And, an excessive probe tip force can damage the corresponding contact, whereas small probe tip force can yield an open circuit.

Accordingly, a primary object of the invention is to provide an improved electro-mechanical module test apparatus which overcomes the above problems.

BRIEF SUMMARY OF THE INVENTION

Testing of electronic packaging or modules has become increasingly difficult because of the fragile nature of the semiconductor chips. During testing the chips are subject to forces that can damage the chips especially when forces are applied unevenly.

During electrical test of the complete module, a great amount of pressure is required at module contact area to assure good electrical connection to the tester's contacting pins. In the case of a module with an array, such as a PBGA, the forces exerted upon the module may be extremely high if the array is of a small spacing between connections (e.g. 1.0-mm grid or less).

Presently, these forces are exerted upon the module either upon the "cap" or "lid" in the case of a "lidded module", or around the peripheral zone in the case of a lidless module. Direct pressure of the level required may not be fully placed upon the mounted silicon chip, as this would damage the chip.

In the instance of a lidless module wherein the peripheral zone is limited due to capacitors mounted on the top of the carrier and where the carrier is made of thin organic based material, a peripherally applied force in a narrow band may exert forces which result in excessive bending stresses in the center of the carrier where the area array of contacts is fully populated.

In the present invention a novel piston is used to conform to the topology of the overall surface area of the module. The piston is tailored by the diameter and length of pressure pins to apply an equal conformed pressure on the surface which will force the chip into electrical and mechanical contact with various testing apparatus such as those which interact with:

thin carrier has full array of contacts upon the bottom, limited area on top for contacting; or where contact pressure with peripheral (window frame) technique, are unable to place large load on chip; or where pressure results in bending of carrier.

The piston of the present invention utilizes an array of pressure pins protruding from the bottom that contact the module below. The top of pins have a customized with the head of the nails arrangement that have a predetermined length and diameter the head of the pins are subjected to equal pressure, but each pin will provide a different force (function of pin head area). The module surface will get pressure, but customized to be at an acceptable level. Net result: less bending of carrier and acceptable test contact method.

In operation, the piston frame may be fitted with a cover which overlies the heads of the pins to thereby form an enclosed chamber. The chamber may be pressurized to force the movable pins downward against the semiconductor chip or interconnect module which is to be tested. Also, a port is provided in the cover so that a gas can be input to the chamber to expand the elastic membrane and thereby force the pins against the contacts of the circuit being tested.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
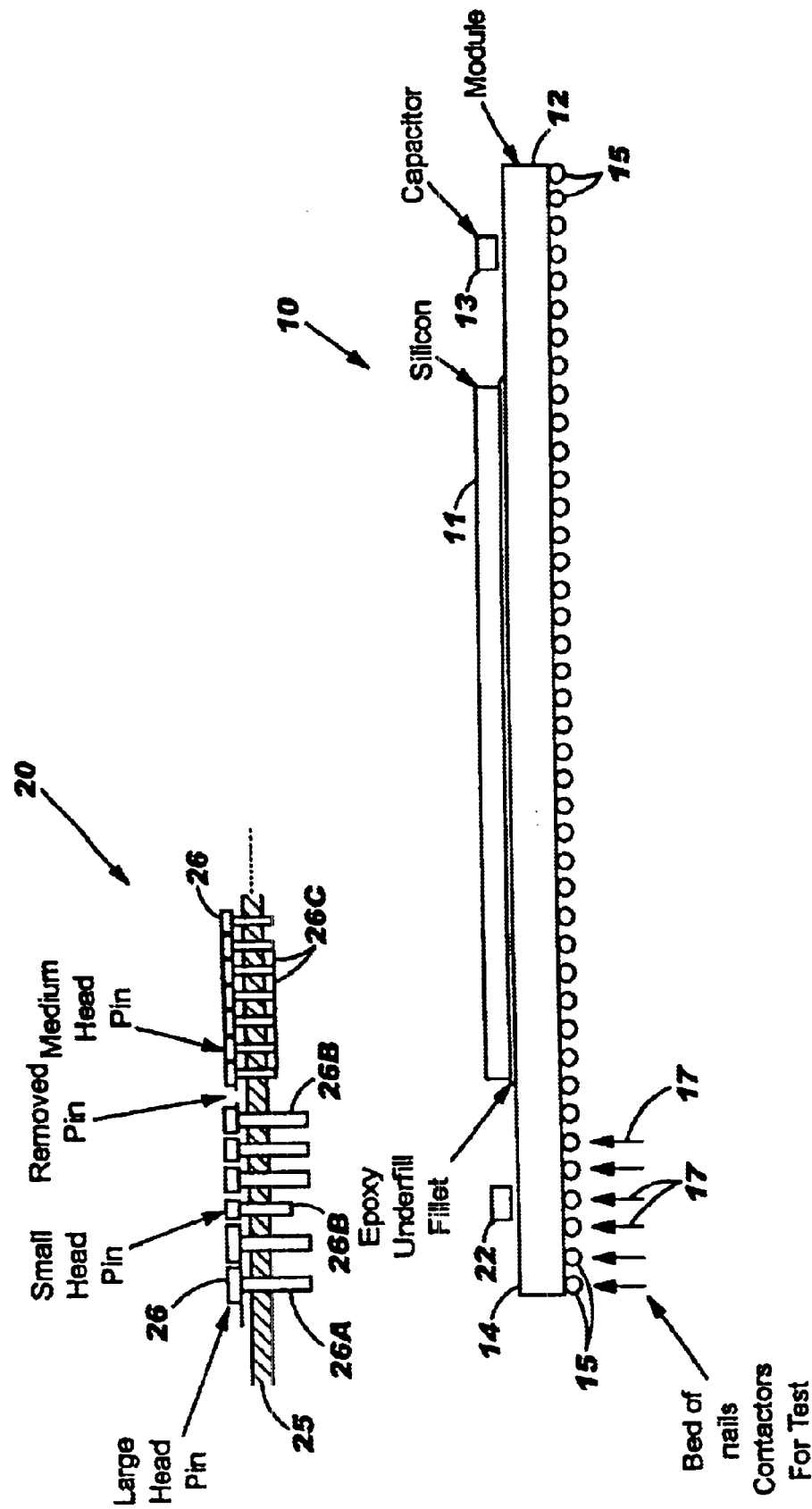
FIG. 1 is a cross-section view of a preferred embodiment of a probe that is constructed according to the invention.

Referring now to FIG. 1, a preferred embodiment of the pertinent parts of a module test assembly in accordance with the present invention, the lower portion is the module 10 under test and above is a portion of an opposed piston structure 20. The module includes a semiconductor chip 11 which could be a complex microprocessor or a system of various devices which would be attached to the top surface 14 of a carrier 12. Other devices 22 and 13 such as capacitors or memory devices would also be attached to the top surface 0f the carrier 12. As is understood in the field the wiring to the devices pass through the carrier 12 and are electrically connected to a contact on the lower surface shown here as PBGA ball contacts 15.

During the module testing process a great amount of pressure is required at the module contact area to assure good electrical connection to the tester's contact pins such as a bed of nails 17 aligned below the module contact 15. The forces exerted upon the top surface of module may be extremely high especially if the array is of small spacing between the connections (e.g. 1.0 mm grid or less). According to the preferred embodiment the opposed piston 20 provides the necessary force evenly over the entire surface of the module. The piston 20 includes a carrier plate or frame 25 which may be constructed of a strong plastic or ceramic material such a material is Vespar™, or a photoimagable ceramic wherein the holes are uniformly created without the need for machining. A large number of holes through which are passed pressure pins 26 of varying lengths and diameters. During test, the bottom portion of the these 26 contact various parts of the module such as 26A will contact the top surface 14, 26B will contact the top of device 22 and 26C will contact the top of chip 11. As should now be understood, the lower portion of the pins are cut to particular length in order to be conformed and compatible to the height and fragility of the parts they are to contact. In fact, if the device below is extremely fragile the pressure pin may be omitted so that no physical contact is made between the piston and the module. If the surface below may support greater force such as on the surface of the module carrier then a wide diameter pin is used with a large head on the top of the pin. An example of where greater force may be applied is in the bulk surface area of the package where no components are mounted upon the top. Lower force is required at the areas where components are mounted (e.g. silicon chip) in order to minimize the torque and shear stresses which would result from the lack of such forces.

Figure 2:
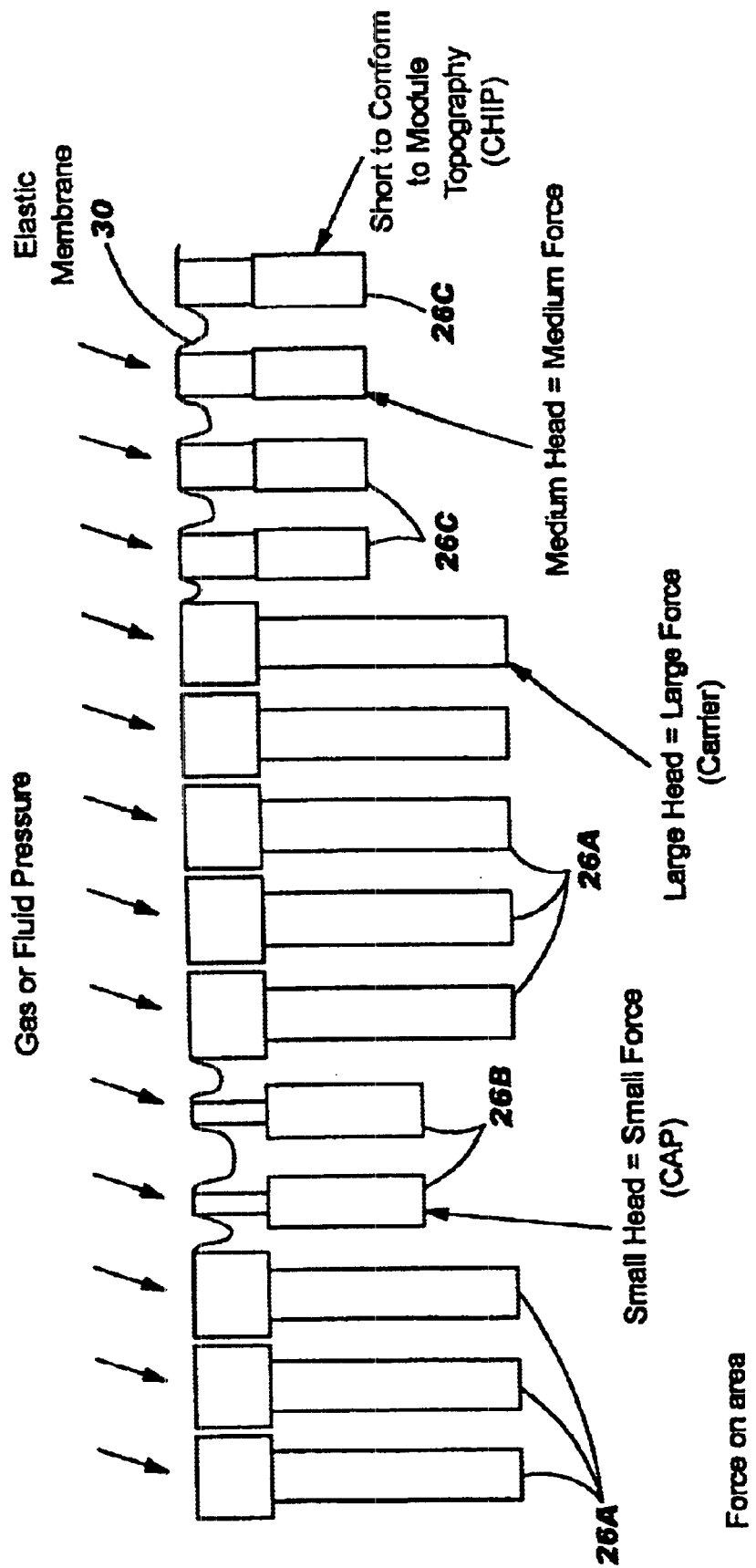
FIG. 2 illustrates an electromechanical assembly of the FIG. 1.

It is envisioned that numerous techniques can be used to force the piston into engagement with the module such as pneumatic or mechanical force once the piston 20 is positioned over the module 10. FIG. 2 illustrates an enlarged view of the piston 20 where an elastic membrane 30 is used to contact the upper surface of the pressure pins 26 so that gas or fluid pressure may be applied to force the pins 26 into contact with the module 10 during test. This membrane may be made of a thin material such as Mylar™, with the pressure supplied by a regulated input of air pressure.

Accordingly, it is to be understood that the invention is not limited to the above details but is defined by the appended claims.

What is claimed is:

1. A piston assembly, for contacting and applying force to a semiconductor module having a variety of devices mounted on its top surface each device having a height and sensitivity to force said piston assembly comprising:

a frame having an upper and lower surface and a plurality of apertures of varying diameter extending laterally through the frame; a plurality of pressure pins loosely positioned through the apertures in the frame, each of said pins having a lower portion, an upper portion, a predetermined length and diameter wherein the length is determined by the height of the device which the lower portion will contact and the pin diameter is determined by the sensitivity to force on the device whereby the lower surface of the pressure pin is conformal to upper surfaces of the devices and applies a variable resultant force to each of the devices.

2. The piston assembly of claim 1 wherein the upper portion of the pressure pins are shaped in a head of nails configuration.

3. The piston assembly of claim 2 wherein the lower portion of the pressure pins has a smaller diameter than the upper portion.

4. The piston assembly of claim 3 wherein a uniform force is applied to the upper portion of the pressure pins.

5. The piston assembly of claim 4 wherein the pressure pins apply a variable force to he upper surfaces of the devices mounted on the module to minimize torque and shear streses.

6. The piston assembly of claim 1 wherein the frame is construted of ceramic material.

7. The piston assembly of claim 3 wherein a uniform force is applied by use of a membrane affixed to the upper portion of the pressure pins.

\* \* \* \* \*